（12）United States Patent
Frosien et al.

(10) Patent No.: US 7,253,417 B2
(45) Date of Patent: Aug. 7, 2007

(54) MULTI-AXIS COMPOUND LENS, BEAM SYSTEM MAKING USE OF THE COMPOUND LENS, AND METHOD USING THE COMPOUND LENS

(75) Inventors: Jürgen Frosien, Riemerling (DE); Pavel Adamec, Haar (DE)

(73) Assignee: ICT Integrated Circuit Testing Gesellschaft, Heimstetten (DE)

( * ) Notice: Subject to any disclaimer, the term of this patent is extended or adjusted under 35 U.S.C. 154(b) by 22 days.

(21) Appl. No.: 10/539,179

(22) PCT Filed: Dec. 12, 2003

(86) PCT No.: PCT/EP03/14140

§ 371 (c)(1),
(2), (4) Date: Jan. 13, 2006

(87) PCT Pub. No.: WO2004/055856

PCT Pub. Date: Jul. 1, 2004

(65) Prior Publication Data

US 2006/0169910 A1 Aug. 3, 2006

(30) Foreign Application Priority Data

Dec. 17, 2002 (EP) .................... 02028345

(51) Int. Cl.
*H01J 3/07* (2006.01)
*H01J 29/51* (2006.01)
(52) U.S. Cl. .................... 250/396 R; 250/396 ML; 250/306; 250/307; 250/492.2; 250/492.3

(58) Field of Classification Search ............ None
See application file for complete search history.

(56) References Cited

U.S. PATENT DOCUMENTS

| 6,750,455 B2 * | 6/2004 | Lo et al. .................... 250/346 |
| 6,784,442 B2 * | 8/2004 | Muraki et al. ............ 250/492.2 |
| 2001/0028038 A1 | 10/2001 | Hamaguchi |

FOREIGN PATENT DOCUMENTS

| EP | 0790634 A | 8/1997 |
| JP | 2002-150989 A | 5/2002 |

OTHER PUBLICATIONS

Haraguchi, T., et al., "Development of Electromagnetic Lenses for Multielectron Beam Lithography System," *Journal of Vacuum Science & Technology B*, (Microelectronics and Nanometer Structures), Nov. 2002, AIP for American Vacuum Soc., USA, vol. 20, No. 6, Nov. 2002, pp. 2726-2729, XP002251379, ISSN: 0734-211X, the whole document.
Patent Abstracts of Japan, vol. 2002, No. 09, Sep. 4, 2002.

* cited by examiner

*Primary Examiner*—Nikita Wells
(74) *Attorney, Agent, or Firm*—Patterson & Sheridan, LLP

(57) ABSTRACT

The invention provides an optical system for a charged particle multi-beam system. The optical system comprises an electrostatic lens component and a magnetic lens component. The components are used to focus a plurality of charged particle beams in a separate opening for each of at least a plurality a charged particle beams traveling through the optical system.

28 Claims, 13 Drawing Sheets

MULTI-AXIS COMPOUND LENS, BEAM SYSTEM MAKING USE OF THE COMPOUND LENS, AND METHOD USING THE COMPOUND LENS

FIELD OF THE INVENTION

The invention relates to an optical system for multiple beam charged particle applications, as inspection system applications, testing system applications, lithography system applications and the like. It also relates to a charged particle beam device with a plurality of charged particle beams and to methods of operation thereof. In particular, the invention relates to a compound optical system for a plurality of charged particle beams, more particularly to an electrostatic magnetic compound lens for multi-beam applications. Specifically, it relates to an optical system for a charged particle multi-beam system, a method for focusing at least two charged particle beams on a specimen and a charged particle beam device.

BACKGROUND OF THE INVENTION

Charged particle beam apparatuses are used in a plurality of industrial fields. Testing of semiconductor devices during manufacturing, exposure systems for lithography, detecting devices and inspection systems are only some of these fields.

In general, there is a high demand for structuring and inspecting specimens within the micrometer or nanometer scale. On such a small scale, process control, inspection or structuring is often done with charged particle beams, e.g. electron beams, which are generated and focused in charged particle beam devices such as electron microscopes or electron beam pattern generators. Charged particle beams offer superior spatial resolution compared to, e.g. photon beams due to their short wavelengths.

However, for a given beam diameter, the charged particle beam current limits the throughput of charged particle beam systems. Since further miniaturization of, e.g. structures to be imaged is necessary, the charged particle beam diameter has to be decreased. As a result, the beam current for individual beams and thus, the throughput has to be decreased.

In order to increase the total charged particle beam current and thus, the throughput, a plurality of charged particle beams can be used. One option for a system applying a plurality of charged particle beams is to combine several single beam columns with each other. However, some of the components, especially magnetic lenses, cannot be miniaturized sufficiently. Thus, the columns have to be spaced such that the electron beams have a distance of 100 mm to 200 mm.

U.S. Pat. No. 3,715,580 shows a multi-electron beam recorder having a new type of magnetic electron lens, whereby a common excitation coil excites a plurality of closely spaced through holes in a circular pole piece. Thereby, due to the common excitation coil, two electron beams can be focused more closely together as compared to the minimal distance of two separate beam columns.

A further multi-beam device is shown in U.S. patent Publication US2001/0028038 A1. Therein, a magnetic lens for a plurality of electron beams is shown. A plurality of lens openings within a pole piece area share one excitation coil.

However, such systems can lack uniformity of the focusing properties with respect to the individual lenses provided by each lens opening. This lack of uniformity is intended to be solved by U.S. patent Publication US2001/0028038 A1 due to lens intensity beam adjusters.

Such a state of the art optic for focusing a plurality of electron beams is shown in FIG. 20. The magnetic lens 200 can be used to focus a plurality of electron beams. The optical axes of the lens are denoted with reference signs 201. The upper pole piece 202 and lower pole piece 203 guide magnetic fields to the openings 204. Within each opening 204 one electron beam is focused. The openings 204 are arranged e.g. in a matrix within the circular pole pieces. Coil 205 provides a magnetic field when excited. Due to the arrangement of the magnetic lens 200, the magnetic field influencing the individual electron beams varies from one opening to the other. The prior art lens intends to compensate for these inhomogeneous focusing properties and further inhomogeneous focusing properties due to manufacturing tolerances. This is intended to be achieved by lens intensity adjuster 206. The lens intensity adjuster 206 accelerates or decelerates the respective electron beam locally within the area of the lens intensity adjuster, thereby compensating for the inhomogeneous field strength of the magnetic lens 200 with respect to the individual openings 204.

Since there is a strong requirement for improving resolution and for minimizing aberrations in such systems, it is an object of the present invention to further improve state of the art devices.

SUMMARY OF THE INVENTION

The present invention intends to provide an improved charged particle multiple beam optical system. Thereby, one object is to improve the uniformity of the focusing properties of the plurality of charged particle beams with respect to each other. According to aspects of the present invention an optical system according to independent claim 1 is provided. Further, a method for focusing at least two charged particle beams on a specimen according to independent claim 21 and a charged particle beam device according to independent claim 26 are provided.

Further advantages, features, aspects and details of the invention are evident from the dependent claims, the description and the accompanying drawings.

According to one aspect of the present invention there is provided an optical system for a charged particle column, comprising an electrostatic lens component and a magnetic lens component. Each component comprises at least two sub-lenses, whereby in each sub-lens a charged particle beams is focused.

According to another aspect of the present invention, an optical system for a plurality of charged particle beams is provided. The charged particle optical system comprises at least two separate magnetic lens field areas and at least two separate electrostatic lens field areas. Thereby, the at least two separate magnetic lens field areas are driven by a common excitation coil. At least two charged particle beams travel through the optical system, each through a separate opening in the optical system. The at least two charged particle beams traveling through the at least two openings are focused or imaged each within one of the at least two magnetic lens field areas and within one of the at least two electrostatic lens field areas.

Thereby, an opening in the optical system is to be understood as respective openings or holes in the components of the optical system. These holes in the components are located such with respect to each other, that a charged particle beam can travel through these holes. Thereby, the hole in the components are not meant to be strictly within on line, since the direction of a charged particle beam can corrected for e.g. by using deflection means.

The above aspect of the present invention enables to increase uniformity of the focusing properties with respect to the individual charged particle beams. Uniformity is to be understood as having similar or homogenous imaging or focusing properties for the individual charged particle beams. The magnetic lens fields and thereby absolute differences of the focusing properties between the individual fields are reduced, since absolute differences decrease for decreasing magnetic fields. Additionally, aberrations with respect to the individual beams can be reduced.

According to a preferred aspect the at least two electrostatic lens field areas are formed by an electrostatic lens component and the at least two magnetic lens field areas are formed by a magnetic lens component. Even more preferred the magnetic lens component comprises a single excitation coil and an upper and lower pole piece. Thereby, the at least two openings in the optical system penetrate the upper and the lower pole piece and the electrostatic lens component.

According to another preferred aspect, the electrostatic lens component comprises at least two electrostatic sub-lenses. Thereby, each sub-lens comprises at least upper and lower electrodes. It is particularly preferred when the upper or lower electrodes of a plurality of sub-lenses are on a common potential with the respective electrodes of other sub-lenses. Thereby, electrodes on a common potential can be provided by a single component having several openings. In this case, the area of the opening for a charged particle beam forms the electrode of the sub-lens for the respective beam.

Within the present application, the term electrode is preferably understood as a component with a homogenous conductivity and thus with a homogenous charge distribution to generate an electric field. According to an especially preferred aspect, this could be achieved with electrodes made of conductors, made of doped semi-conductors like doped silicon or made of other materials with similar conductivity.

The preferred aspects above can be used independently, in combination with one aspect or with several aspects to provide an optical system for a plurality of charged particle beams, whereby the uniformity with respect to the individual beams can be increased without increasing the effort to individually control correction means for individual charged particle beams. However, further individual correction means can optionally be applied. Further, aberrations of imaging individual charged particle beams can be decreased and the distance between adjacent charged particle beams is less limited as compared to combining separate charged particle beam columns. According to another preferred aspect, electrons are used as charged particles.

According to another preferred aspect, the openings in the optical system are arranged in a single row, parallel rows, star-like arrangements or rotational-symmetric arrangements. These arrangement-types of the openings for charged particle beams in the optical system will generally be referred to as an array.

According to another preferred aspect, the upper electrode and the lower electrode of the at least two sub-lenses form at least two immersion sub-lenses, and more preferably at least two retarding sub-lenses. Thus, the energy of a charged particle impinging on a specimen is reduced compared to the charged particle energy during focusing and imaging of a charged particle beam. Therefore, aspects like reduction of specimen damage and imaging quality can be improved independently.

According to another preferred aspect, a specimen, whereon a charged particle beam should be focused, can be biased. Thereby, the electrical field, which is externally introduced to the optical system due to the biased specimen, modifies the electrostatic lens fields of the electrostatic sub-lenses.

According to another preferred aspect, each magnetic lens field area of the at least two lens field areas overlaps with a respective electrostatic lens field area of the at least two electrostatic lens field areas. According to another preferred aspect the optical system comprises at least two beam boost potential tubes. More preferred one electrode of each of the at least two electrostatic sub-lenses is used as a beam boost potential tube. These preferred aspects decrease aberrations and thereby improve resolution of a charged particle system.

According to another preferred aspect, means for individual fine adjustment of the focusing properties of the at least two charged particle beams are provided.

According to another preferred aspect, the optical system comprises scan deflection means, whereby the scan deflection means are more preferably formed as in-lens deflection units. According to another preferred aspect the optical system further comprises detection means. Integrating several components has the advantage of shortening a charged particle beam column. Since imaging quality is to some degree influenced by charged particle interaction, shortening the beam column reduces the electron-electron interaction. Thus, imaging quality can be improved by shortening the charged particle beam column.

According to a further aspect of the present invention, there is provided a method, which comprises the steps of providing an optical system with an electrostatic lens component and a magnetic lens component. Thereby, a separate opening for each of the at least two charged particle beams traveling through the optical system is provided. Further, a current for a common excitation coil is controlled, thereby focusing the at least two charged particle beams in the magnetic lens component, and the potentials of the electrostatic lens component are controlled, thereby focusing the at least two charged particle beams in the electrostatic lens component. In this context, controlling a potential of an electrode is to be understood as not having an electrically floating electrode.

According to a preferred aspect, at least two electrostatic immersion sub-lenses each with at least two electrodes are provided. Thereby, more preferably one of the at least two electrodes of each of the at least two electrostatic sub-lenses are controlled to be on a common potential with a respective electrode of a further sub-lens. However, it can also be preferred that the potential of one of the at least two electrodes of each of the at least two electrostatic sub-lenses are controlled separately. Thus, electrodes of one type of electrode, preferably the upper electrode, can be on a common potential. Whereas, potentials of electrodes of the other type of electrode, preferably the lower electrode, are individually controlled.

According to a further aspect of the present invention, a charged particle beam device for a plurality of charged particle beams is provided. The device comprises a charged particle beam source, beam shaping means, a housing capable of being evacuated and at least one optical system according to an aspect mentioned above.

The invention is also directed to apparatus for carrying out the disclosed methods including apparatus parts for performing each of the described method steps. These method steps may be performed by way of hardware components, a computer programmed by appropriate software, by any combination of the two or in any other manner. Furthermore, the invention is also directed to methods by which the described apparatus operates or is manufactured. It includes method steps for carrying out every function of the apparatus.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE DRAWINGS

Without limiting the scope of protection of the present application, in the following the charged particle multi-beam device will exemplarily be referred to as an electron multi-beam device. Thereby, the electron beam device with a plurality of electron beams might especially be an electron beam inspection system. The present invention can still be applied for apparatuses using other sources of charged particles and/or other secondary charged particles to obtain a specimen image. Those skilled in the art would also appreciate that all discussions herein related to voltages and potentials refer to relative and not absolute terms. For example, accelerating the beam by connecting the cathode to "ground" and applying 3 kV to the sample is equivalent to applying negative 3 kV to the cathode and placing the specimen on ground. Therefore, while for convenience some discussion is provided in terms of specific voltages, it should be understood that the reference is to relative potential.

The present invention intends to provide a more sophisticated method and apparatus to compensate for inhomogeneous magnetic fields. Thereby, the magnetic focusing fields are reduced. Thus, the absolute differences in the focal length based on the individual magnetic lens fields are reduced, as well.

The enlarged focal length is compensated for by an electrostatic immersion lens. An immersion lens is characterized by having a different electron energy before and after traveling trough the immersion lens. By reducing the magnetic focusing field and compensating for this reduction by an electrostatic focusing field, the inhomogeneity of the field strength influencing the individual electron beams is at least partly reduced. For this improvement, it is not necessary to add any control means or the like influencing the individual electron beams.

Specific embodiments and aspects of the present invention will be described with respect to FIGS. 1 to 19 in the following. Therein, all figures are drawn such that the primary charged particle beam travels from top to bottom. Thus, a primary charged particle beam is above an optical system before traveling through the optical system. After traveling through the system the primary charged particle beam is below the optical system. The opposite applies to secondary or backscattered charged particles. A first embodiment of the present invention is shown in FIG. 1.

Figure 1:
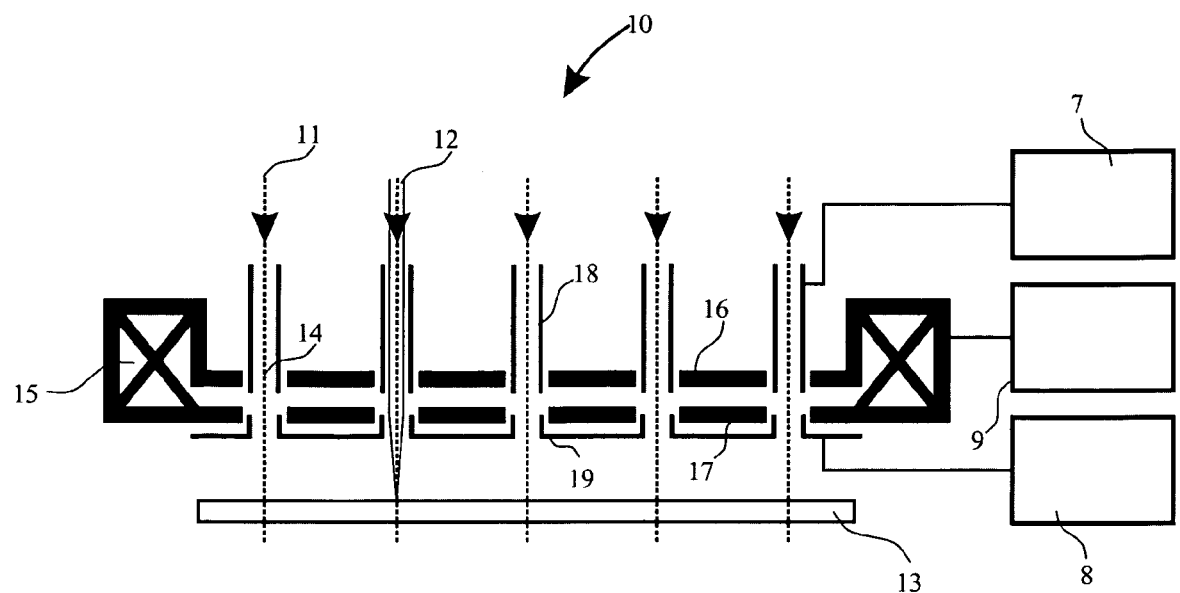
FIG. 1 shows a schematic side view of an embodiment of an optical system according to the invention with an immersion lens component, a magnetic lens component and respective controllers.

The following components can be seen in FIG. 1. Optical system 10 comprises a magnetic lens component. This magnetic lens component comprises an excitation coil 15. The diameter of this coil is about 100 mm to 1000 mm.

Preferably, it is between 100 and 400 mm. Thereby, the coil diameter depends in general on the number of electron beams 12 focused by the optical system. However, the coil diameter can also depend on other aspects, as the electron beam distances, the size of the pole piece area between the array of openings 14 and the coil 15 or the like. The dimensions and parameters provided should be understood as a mere example and non-limiting.

Further, there is an upper pole piece 16 and a lower pole piece 17. These pole pieces are preferably made of a magnetic conductive material, like permalloy or metal. In addition to the magnetic lens component there is an electrostatic lens component. The lens system can be described as a plurality of sub-lenses for each of electron beams 12. In the embodiment of FIG. 1, each of the electrostatic immersion sub-lenses of the electrostatic lens component comprises an upper electrode 18 and a lower electrode 19. These electrodes should be made of a non-magnetic conductive material. Openings 14 provided in the electrostatic components and magnetic components overlap in a manner that in general each electron beam 12 can travel through the optical system using a different opening. Preferably, the openings are positioned with respect to the optical axes 11 of the electron beams such that the focusing fields influence the electron beams in a symmetrical manner. In order to control the focusing of the optical system 10, controller 7 for the upper electrode 18, controller 8 for a lower electrode 8 and controller 9 for the excitation coil are provided. Controllers 7 and 8 are connected to a common upper or lower electrode for the sub-lenses. Thereby, the upper and the lower electrodes, respectively, are connected to each other such that only a single connection to controllers 7 and 8 are required.

The function of optical system 10 of FIG. 1 will be explained in the following. Several electron beams 12 with an optical axis 11 are for example focused on specimen 13. The magnetic focusing field is induced to the pole pieces by excitation coil 15. Controller 9 drives excitation coil 15. Close to the excitation coil, cooling units (not shown) can be located. The pole pieces guide the magnetic focusing field to openings 14 for the electron beams. These openings are provided in upper pole pieces 16 and lower pole pieces 17. Due to the focusing fields within the openings 14, the electron beam is focused. To further focus an electron beam 12 by an electrostatic lens, a first electrode 18 and a second electrode 19 are provided. Different potentials are applied to electrodes 18 and 19 by controllers 7 and 8, respectively.

Describing the invention in general terms, the above embodiment can be interpreted as follows. According to one aspect of the present invention, there is an optical system for a plurality of charged particle beams. Thereby, an electrostatic lens and a magnetic lens is provided. There are at least two charged particle beams, which are focused. Each charged particle beam of the at least two charged particle beams travels through the optical system using a separate opening.

Preferably, the magnetic lens component comprises an excitation coil and at least an upper and a lower pole piece. The separate openings for each of the at least two charged particle beams thereby penetrate the electrostatic lens and upper and lower pole pieces of the magnetic lens.

According to another preferred aspect, generally, independent of the embodiment of FIG. 1, controllers 7 and 8 can either be connected to a common upper or lower electrode for the sub-lenses or they are able to control at least a plurality of electrodes or a set of electrodes independently.

As can be seen from FIG. 1, optical system 10 focuses electron beams 12 on specimen 13. If the optical system 10 is used as an objective lens, it is preferred to have potentials on electrodes 18 and 19, respectively, such that the charged particles are decelerated before impinging on the specimen. Thus, for electrons and other negative charged particles, the upper electrode 18 should be on a more positive potential than the lower electrode 19. For positively charged particles, the upper electrode should be on a more negative potential than the lower electrode.

Therefore, the energy of a charged particle beam above and below the optical system 10 is preferably significantly changed (immersion lens). The immersion ratio R is <1 for a deceleration and >1 for an acceleration.

$$R = \sqrt{\frac{V_{FINAL}}{V_{INTERMEDIATE}}}$$

Generally, it is preferred to have immersion ratios R smaller than ¼ (deceleration) or larger than 4 (acceleration). Thereby, $V_{FINAL}$ is the beam voltage (beam energy) for a primary electron beam below the lens and $V_{INTERMEDIATE}$ is the beam voltage above the lens.

The deceleration of the primary electron beam in, e.g. an objective lens has two different effects. First, the electrons impinge on a specimen with reduced energy. Second, the electrons travel through the optical system with higher beam energy.

Due to a retarding field, the electron energy of an electron impinging on a specimen can be reduced. This is especially relevant for imaging and inspection purposes. A specimen to be imaged, e.g. an integrated circuit, is preferably not charged by the electron beam. Therefore, however, the beam energy has to be reduced to obtain a balance between emitted secondary electrons and accepted primary electrons.

Further, the higher beam energy above and partly within the optical system can be advantageous. Aberrations and influences of the so-called Boersch effect are reduced by higher beam energies. For example, chromatic aberrations depend on $\Delta E/E$. Thereby, $\Delta E$ is the energy spread of an electron beam. This energy spread or energy variation might be introduced by an electron gun or by a variation of acceleration voltages. To minimize the term $\Delta E/E$, the mean electron beam energy E can be increased. Thereby, chromatic aberrations are decreased. Thus, a high beam energy above one to several keV before and during the focusing is advantageous.

Since on the other hand electrons should impinge on a specimen with an energy of for example below 1 keV, an immersion lens can be considered advantageous for some applications.

The above description of the deceleration of an electron beam with respect to FIG. 1 referred to, e.g. an objective lens or an intermediate lens. As mentioned above, during imaging of an electron beam in an electron column and traveling of an electron beam through an electron column, higher beam energies are preferred. Thus, a condenser lens, as exemplarily shown in FIG. 2, preferably accelerates the respective electron beams.

Figure 2:
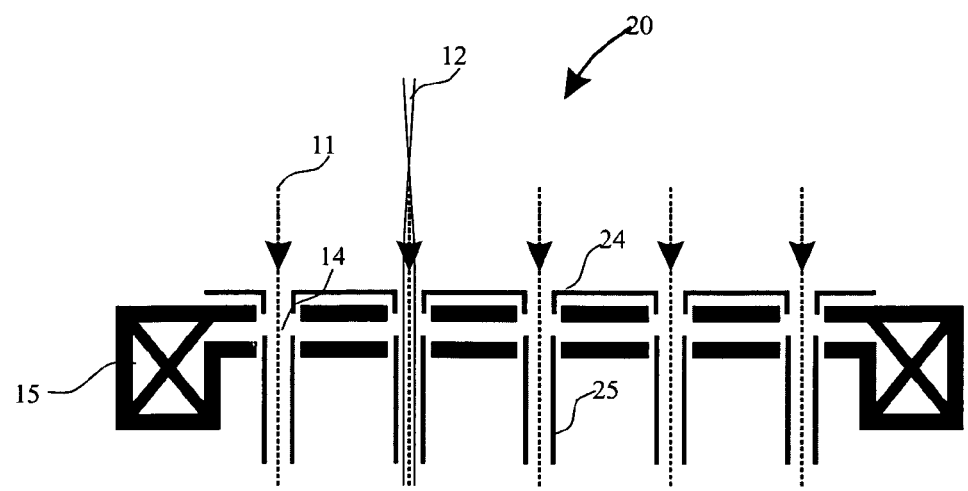
FIG. 2 shows a schematic side view of a first embodiment of an optical system according to the invention in the form of a condenser lens.

In FIG. 2, a further example for an embodiment of an optical system is shown. Components or aspects already described in FIG. 1 will not be referred to again. Within condenser lens 20, electrons of electron beams 12 are accelerated. Therefore, upper electrode 24 is less positive than lower electrode 25. The crossover of electron beam 12 is above the condenser lens 20. According to the general aspect of the present invention, the optical system 20 comprises a magnetic lens component (coil 15 and pole pieces) and an electrostatic immersion lens component (electrodes 24 and 25).

According to comparable arguments presented with respect to the decelerating objective lens, it is preferred for a condenser lens to have an electron beam energy of at least three keV below condenser lens 20. Thus, an electron beam travels through the electron beam column with high energies on a boost potential of, e.g. at least three keV. Thereby aberrations and negative influences of for example the Boersch effect can be reduced.

Schematic top views of embodiments of optical systems will next be described with respect to FIGS. 3a to 3d. The region 16a of the upper pole piece is exemplarily drawn circular. The lower pole piece is in this view be located below the upper pole piece. The pole pieces are surrounded by the excitation coil 15a. By the excitation coil the magnetic field is generated. The pole pieces guide the magnetic field to openings 14. Further, electrodes 18a are shown. The openings through the optical system provided in the electrodes overlap with the openings in the pole pieces.

An electron beam passing through one of openings 14 is focused by the electrostatic and magnetic lens fields provided. Thereby, the magnetic and electrostatic components of the lens are preferably arranged to enable symmetric focusing fields.

Figure 3A:
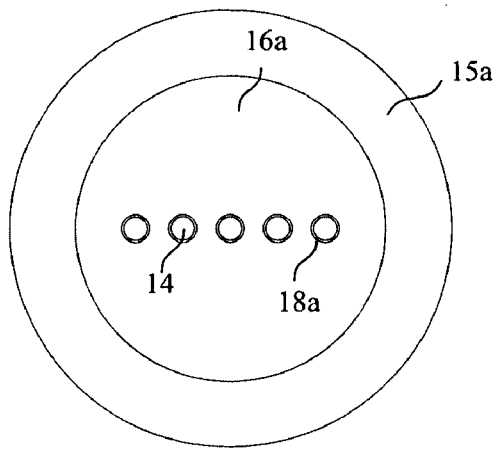
FIG. 3*a* to 3*d* show schematic top views of optical systems according to the invention.

Within FIG. 3a, the openings 14 are provided within one row. Thus, at least in two directions of each opening 14 (upper and lower side in FIG. 3a) there are no further neighboring openings. Therefore, the magnetic field is directly guided to the openings. There is no interference of other components or openings with respect to these two sides. If in an imaging apparatus this optical system is provided with the orientation of FIG. 1, it might be advantageous if each electron beam is scanned in a direction substantially parallel to the direction given by the row of openings 14. If a specimen is moved by a specimen stage in a direction substantially orthogonal, an increased width of a specimen can be scanned due to the usage of several electron beams. Further, the increased number of beams decreases the beam current limitations. As explained above, the beam current of each individual electron beam cannot be arbitrarily increased for a fixed beam diameter. However, using a plurality of beams can increase the total current of all beams, which can be applied to the specimen simultaneously.

Figure 3B:
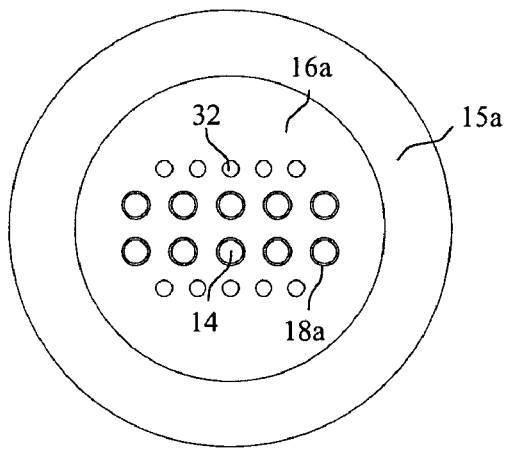

FIG. 3b shows a further embodiment. Therein, two rows of openings are provided. In general, several rows of openings form an m×n matrix. The upper row might be influenced by the existence of the lower row and vice versa. Thus, it might be preferred to add additional openings 32. These additional openings 32 are not used for trespassing and focusing electron beams. However, the uniformity of the magnetic fields guided to openings 14 can be increased, since each opening 14 has a similar adjacent influencing area. The additional openings 32 ("dummy" openings) can be used for all embodiments shown in FIGS. 3a to 3d.

The additional openings 32 in FIG. 3b are smaller than openings 14. This should be understood as an example. Further, the geometry of additional openings 32 are exemplarily shown as a top and bottom row. Other geometries and sizes are well within the scope of protection. Additional openings 32 are used to further homogenize the magnetic fields with respect to differences in the individual openings 14. Different size distributions and geometries of additional openings 32 might be used to further decrease differences between openings 14.

Figure 3C:
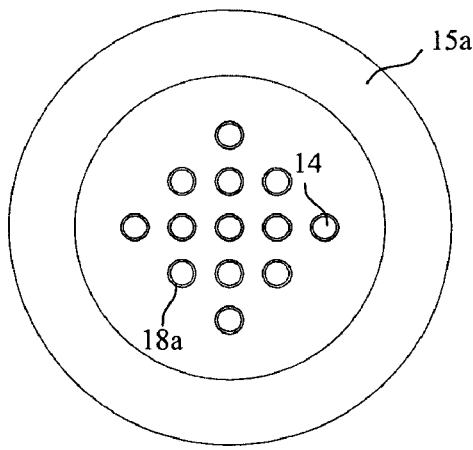
Figure 3D:
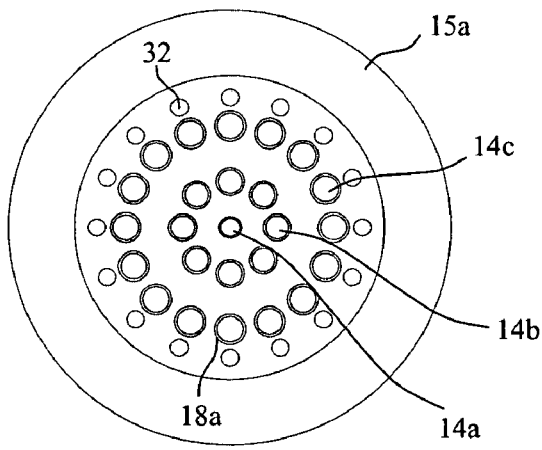

FIG. 3c and 3d show further embodiments of the optical system. Openings 14 in FIG. 3c are provided in four-fold geometry forming a diamond-like pattern. Higher order symmetries can also be realized. FIG. 3d shows a rotationally symmetric arrangement of openings 14. Additional openings 32 are provided as well. Further, it can be seen that openings 14a, 14b and 14c have different diameters. Such an arrangement can further be used to homogenize the lens fields.

Within this application, all of the arrangements of openings 14 of the embodiments of FIGS. 3a to 3d and the like will be referred to as an array of openings.

Figure 4:
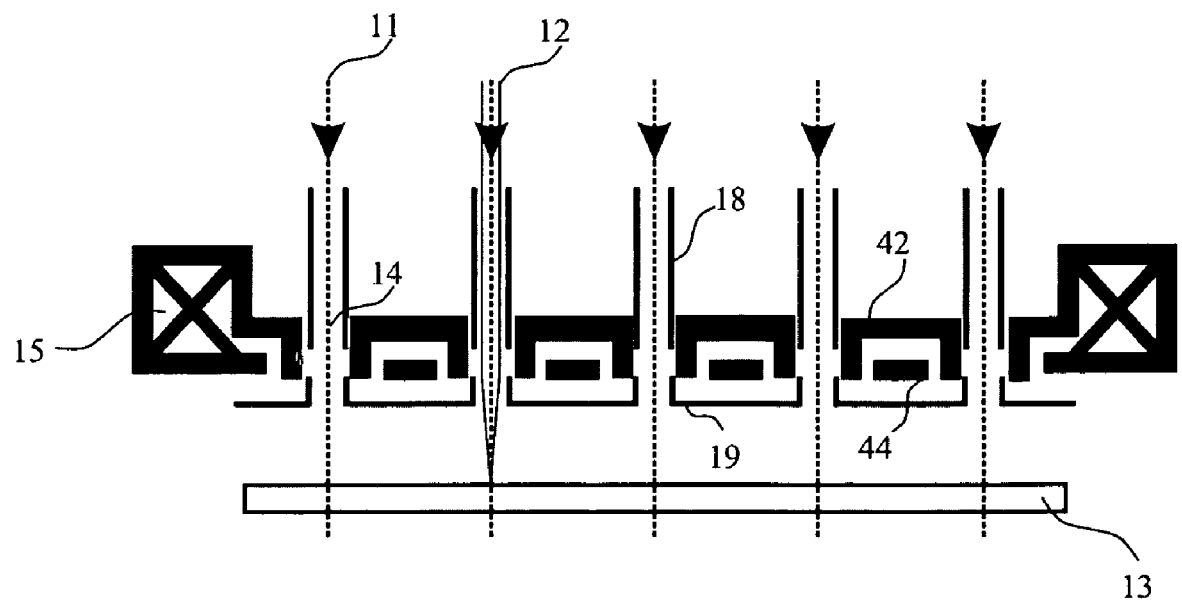
FIG. 4 shows a schematic side view of a further embodiment of an optical system according to the invention, wherein radial gap lenses are provided.
Figure 5:
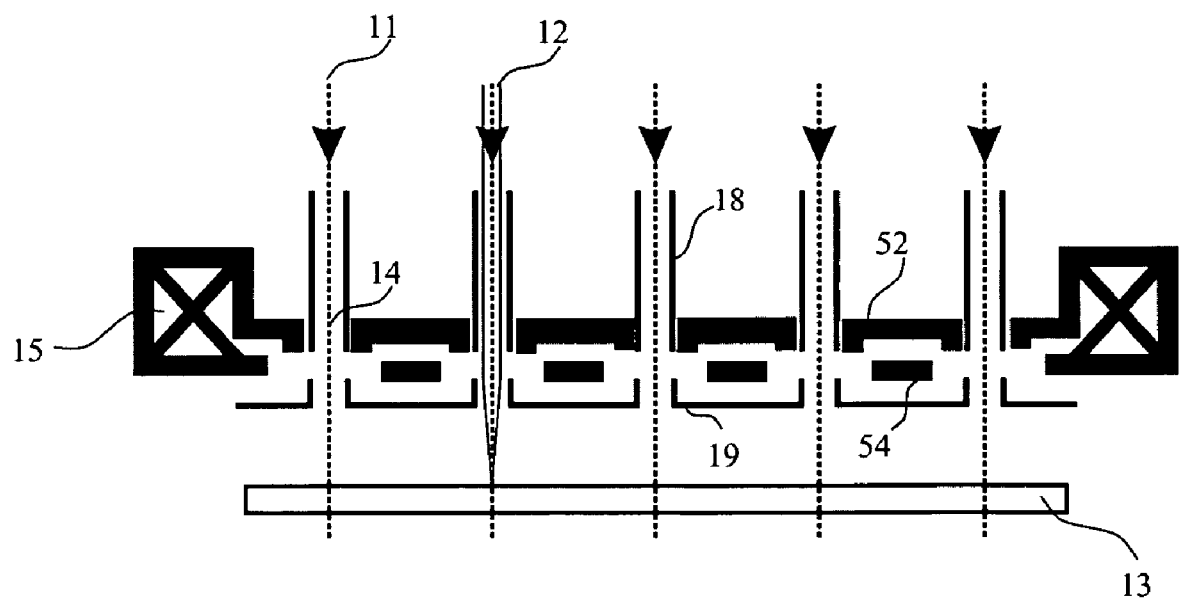
FIG. 5 shows a schematic side view of a further embodiment of an optical system according to the invention, wherein radial-axial-gap lenses are provided.

An additional preferred aspect of the present invention can be seen from the embodiments shown in FIGS. 4 and 5. As an alternative to FIG. 1 wherein the magnetic lens component has pole pieces such that axial gap lenses are formed, FIG. 4 shows an embodiment with differently shaped pole pieces such that radial gap lenses are formed. Thereby, the upper pole piece 42 and the lower pole piece 44 guide the magnetic field in a region below the lower pole piece.

In general, radial gap lenses yield to better imaging properties. For example, aberrations can be reduced by the usage of radial gap lenses. However, radial gap lenses require more space and an increased excitation power. With respect to radial gap lenses, the present invention provides an additional advantage. Since there is no need to miniaturize several excitation coils of a plurality of small magnetic lenses, but one common excitation coil is used instead, the excitation coil dimensions and its excitation power can be increased. Further, additional space is made available for the pole pieces. As a result, for the present invention radial gap lenses can be applied more easily.

As can be seen from FIG. 5 according to one embodiment of the present invention, a combination of an axial gap lens (see FIG. 1) and a radial gap lens (see FIG. 4) can also be used. Upper pole piece 52 and lower pole piece 54 are formed to have a gap between the pole pieces that is a combination of FIG. 4 and FIG. 5, thereby forming a radial-axial gap lens. Thereby, a compromise for the advantages and disadvantages mentioned above can be made. According to further embodiments shown in FIGS. 6 and 7, features of the electrostatic lens component can be varied or modified. Similar to FIG. 1, both embodiments have an excitation coil 15 with an upper pole piece 16 and a lower pole piece 17. The pole pieces guide the magnetic field to openings 14. Therein, the electron beams 12 are focused.

Figure 6:
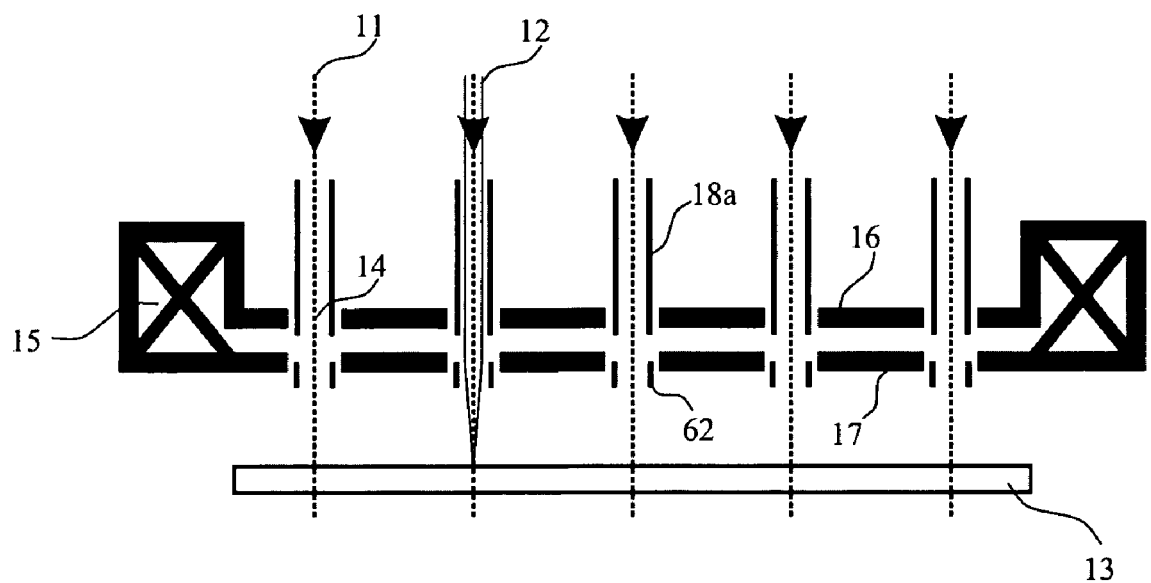
FIG. 6 shows a schematic side view of a further embodiment of an optical system according to the invention, wherein tube electrodes for the immersion lens component are provided.

In FIG. 6 the upper electrodes 18a of the electrostatic immersion sub-lenses are in the form of a tube. As explained above, for an objective lens, when imaging negative charged particles, this tube is preferably on positive potential above three kV. Thereby, a beam boost potential is provided. The embodiment of FIG. 6 shows a lower electrode 62, which is given by a second tube substantially below the lower pole piece 17. As already explained above, for positively charged particles, the upper electrode should be on a more negative potential than the lower electrode. Thus, for positive charged particles the beam boost potential would be, e.g. below minus three kV.

Figure 7:
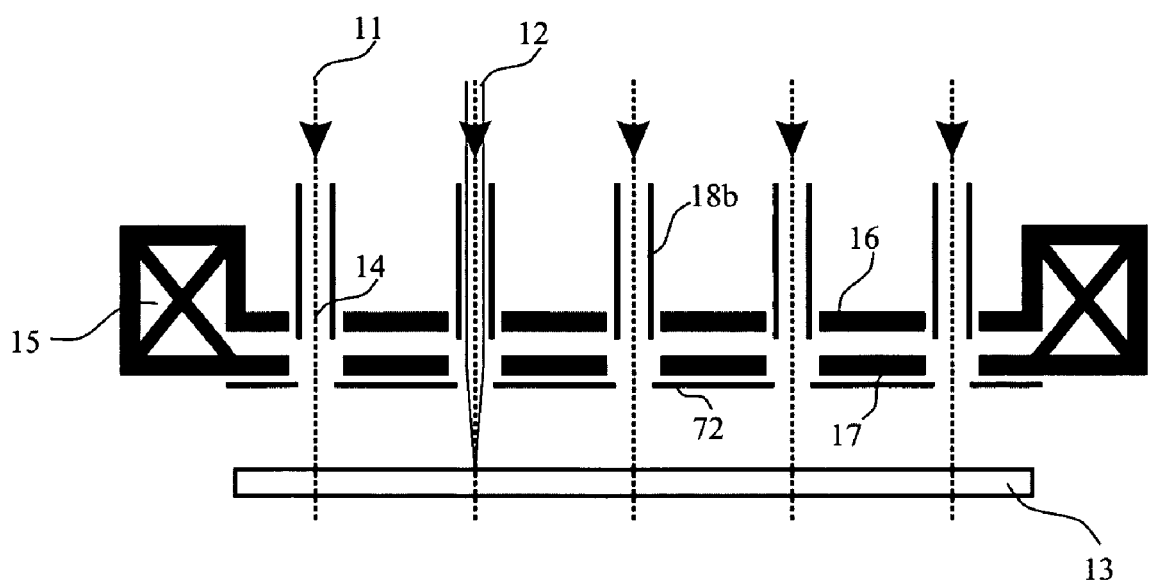
FIG. 7 shows a schematic side view of a further embodiment of an optical system according to the invention, wherein planar electrodes for the immersion lens component are provided.

In the further embodiment in FIG. 7, the lower electrode 72 is provided by a planar electrode. This preferred aspect might be advantageous in case a focal length of the optical system should be reduced. In general, due to shorter focal length, a spherical aberration can be reduced. Therefore, a shorter focal length might be superior if small electron beam spots are required. To take advantage of a short focal length, the distance between e.g. a specimen and the lens system has to be reduced. Thereby, constructive aspects might be a limiting factor. Thus, a thin planar lens electrode might be preferred.

Figure 8:
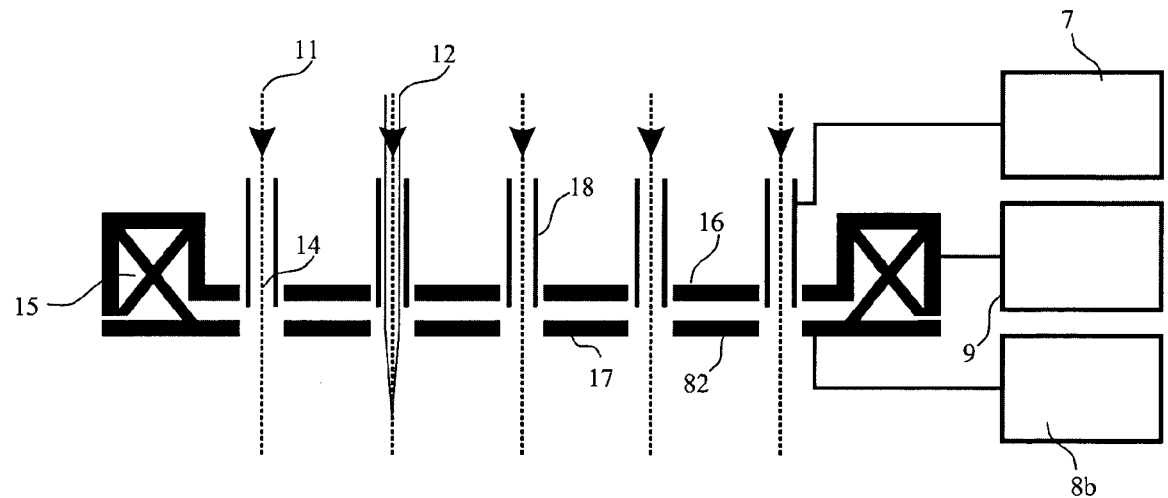
FIG. 8 shows a schematic side view of a further embodiment of an optical system according to the invention, wherein the lower pole piece of the magnetic lens component is used as an electrode.

Two further embodiments will now be explained with respect to FIGS. 8 and 9. If for example the distance between the optical system and a specimen should be further reduced, it is possible to use the lower pole piece 17 as the lower electrode 82 of the electrostatic immersion lens component. Besides providing a potential to the upper electrode 18 and a current to the excitation coil 16 a further potential is provided to the lower pole piece 17. Thereby, in addition to the upper electrode controller 7 and the excitation coil controller 9, the lower electrode controller 8b is used. For this preferred embodiment at least the lower pole piece should preferably consist of an electric and magnetic conductive material, like permalloy or µ-metal.

Besides the advantage mentioned above, this embodiment of FIG. 8 also reduces the constructive effort, since one component of the optical system can be omitted. The advantage thereof becomes apparent when the high precision required for each component is considered.

A further effect, which might thereby also be influenced, is described below. According to different embodiments, it is possible to have the magnetic lens field above the electrostatic lens field. It is also possible to have the magnetic lens field below the electrostatic lens field. It is further possible to have the magnetic lens field and the electrostatic lens field overlapping substantially, to a large extent or to some degree. It will be apparent that there are further embodiments to achieve this effect.

As an example, one of the above possibilities will now be explained. Especially for an objective lens focusing a primary electron beam on a specimen, aberrations have to be minimized. As explained above, e.g. chromatic aberrations can be reduced for high beam energies. Therefore, it is preferred to have the deceleration immersion lens component below the magnetic lens component. Thus, the electrons trespass the magnetic lens component with high electron energy. Thereby, the chromatic aberration of the magnetic lens component can be reduced. For this reason, it is preferred for this example to have the electrostatic lens field below the magnetic lens field. Thus, the electrostatic lens field should be positioned intentionally with respect to the magnetic lens field. This can be achieved by positioning the components, by shaping components or by using one component for more than one functionality (see FIG. 8).

Figure 9:
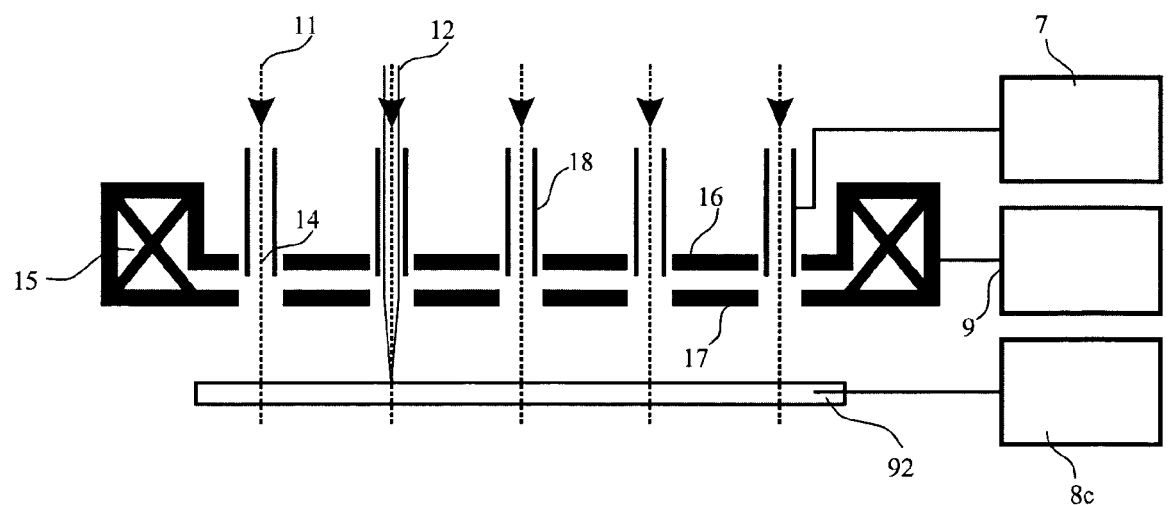
FIG. 9 shows a schematic side view of a further embodiment of an optical system according to the invention, wherein the specimen or a respective specimen stage is biased.

According to a further embodiment shown in FIG. 9, a lower electrode 19 (see FIG. 1) can be avoided. In this special case, the electrostatic immersion sub-lenses of the optical system comprise an upper electrode 18 and a specimen, which is biased. Thus, a voltage difference between the upper electrode 18 and the specimen is used to constitute an immersion lens. However, in the context of this application, the term "electrode", as regards the electrostatic sub-lenses or the electrostatic lens component is not to be understood as referring to a specimen. In other words, within the terminology of the present application, the specimen is not an electrode as regards the electrostatic sub-lenses or the electrostatic lens component. In FIG. 9a controller 8c for biasing the specimen is provided. Thereby, a fixed voltage is provided to specimen 92. This potential can either be provided via a specimen stage or by direct contact with the specimen. Generally, this aspect of the present invention, namely to bias the specimen, can be combined with other aspects shown in the various embodiments.

As already explained with respect to the general aspect of the present invention, an object is to provide an optical system wherein the uniformity of the focusing properties with respect to the focusing properties for individual beams is increased. According to an aspect of the present invention, this is done by reducing the field strength of the magnetic focusing field. As explained with respect to FIGS. 3a to 3d, further improvement can be made by intentionally shaping openings 14, the arrangement thereof or using additional "dummy" openings 32 (see FIG. 3)

However, further variations with respect to the focusing properties of the individual openings 14 might still occur. One reason therefore might be manufacturing tolerances. Thus, it might be preferred to additionally provide means for individually correcting the imaging properties for each electron beam 12 respectively.

Figure 10:
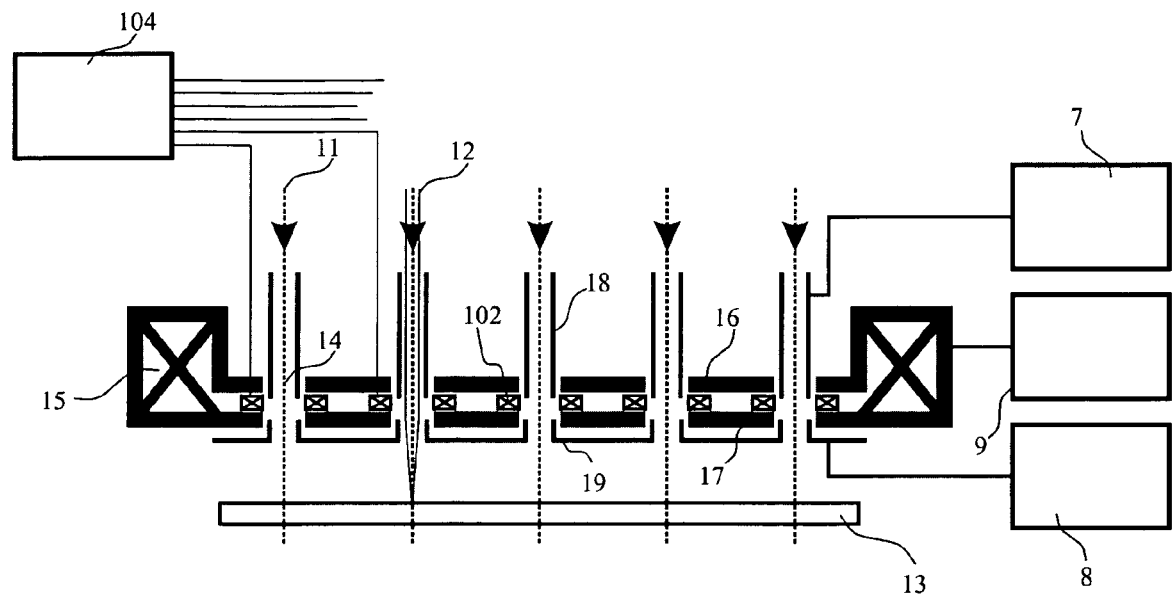
FIG. 10 shows a schematic side view of a further embodiment of an optical system according to the invention, wherein fine adjustment means for individual correction of the optical system are provided.

In FIG. 10, small magnetic coils 102 are provided for each opening 14. A controller 104 for the individual coils is used to adjust the focusing properties independent of each other. Since only small correction fields have to be applied for the individual electron beams, the magnetic focusing correction means can be miniaturized.

Figure 11:
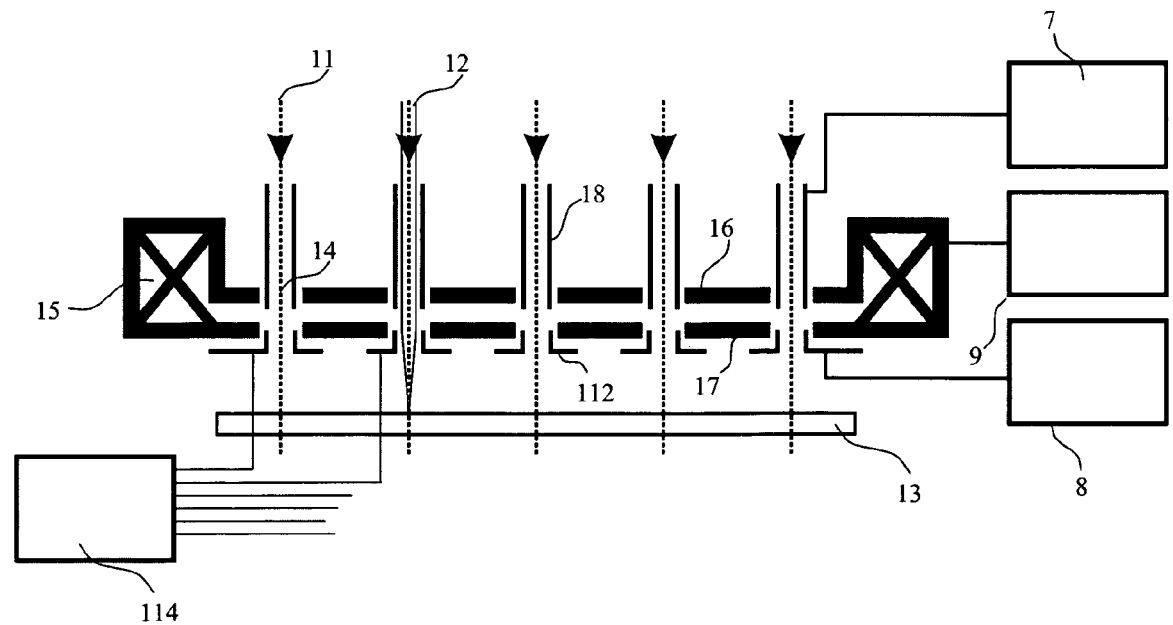
FIG. 11 shows a schematic side view of a further embodiment of an optical system according to the invention, wherein fine adjustment means for individual correction of the optical system are provided.
Figure 12:
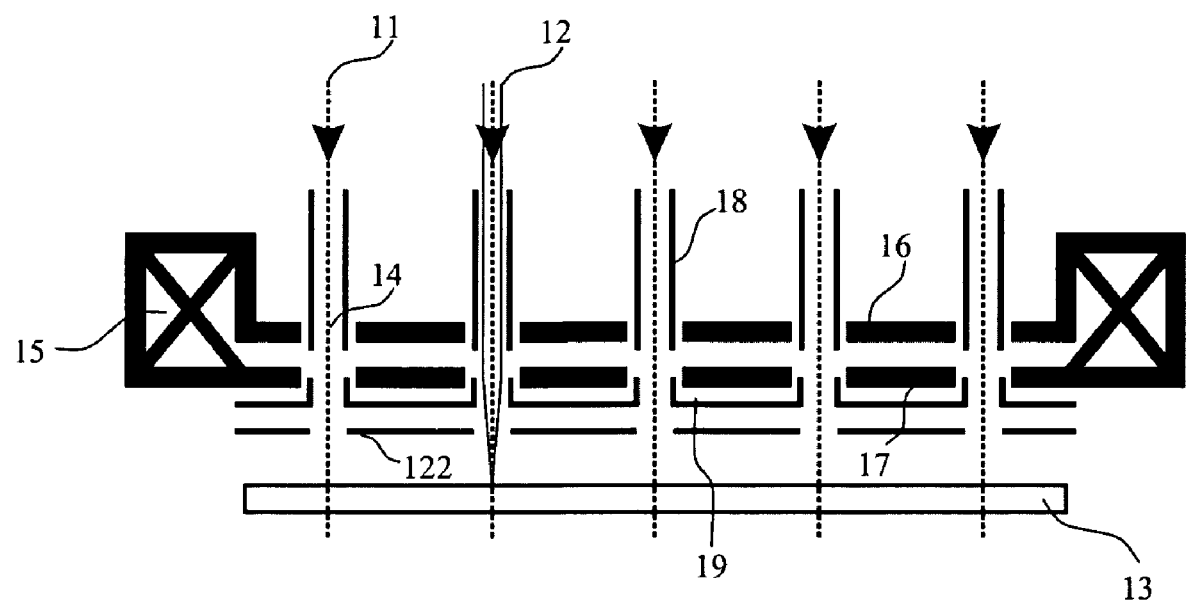
FIG. 12 shows a schematic side view of a further embodiment of an optical system according to the invention, wherein separate extractions electrodes are provided.

In FIG. 11, lower electrode 112 is provided such that the potential for focusing each electron beam 12 can be adjusted individually. Thereby, one solution might be to provide a common potential to all sub-areas of lower electrode 112. Additionally, controller 114 provides a correction potential to the sub areas. For the realization of this embodiment, it is required to have a sufficient resistance between the individual sub-electrodes 112. Under this condition, individual correction potentials can be applied. Alternatively, it is possible to have completely independent electrodes 112. In this case lower electrode controller 8 is not required. Using electrically disconnected sub-electrodes, controller 114 provides an individual potential for each sub-electrode. Thus, controller 114 might be used as a controller for correction purposes and as a controller for providing each sub-electrode with an individual potential.

A further embodiment for individual control means for the imaging properties of the optical system can be realized by varying the beam energies of the individual electron beams. As explained above in a different context, the beam energy can be used to vary the focusing properties of constant lens fields. This might be understood as follows. A constant electrostatic lens field applies a constant force to an electron. The less energy a primary electron beam has, the slower a primary electron travels. Thus, a low energy electron needs more time to pass through the area wherein the constant force acts on an electron. Consequently, a slower electron is deflected stronger.

Therefore, means for controlling the electron beam energy, as e.g. a controller for an anode potential, a cathode potential or any other acceleration or deceleration electrodes can be used to individually vary the energy of the electron beams. Thereby, the focusing property for each electron beam can be controlled individually.

Most of the embodiments mentioned above used a lower electrode 19 as a part of an electrostatic lens component. Besides influencing the primary electron beam, an electrode above the specimen extracts secondary or backscattered particles emitted by the specimen. This extraction property of an electrode above the specimen can be used to control the imaging of secondary or backscattered particles with a detector. Thereby, the number of particles detected e.g.

during an inspection procedure varies dependent on the extraction voltage applied to an extraction electrode.

Another embodiment for means, which individually control the focusing properties of the lens, will be explained below. As can be seen with respect to FIG. 11, sub-electrodes 112 of the lower electrode are controlled by controller 114. Analogously, it is possible to control the potential of sub-electrodes of the upper electrode 18 individually. In view of the above, this can be considered advantageous.

As mentioned above, the variation of the potential with respect to each sub-electrode 112 of lower the electrode can influence the detection of secondary particles. Thus, if an operator varies the potential of a lower sub-electrode to vary the focusing properties, the detection will be changed as well. However, this coupling of two effects is in general not desirable. Thus, according to a further embodiment shown in FIG. 12, an additional extraction electrode 122 is provided. In this embodiment, an extraction electrode 122 and a common lower electrode 19 are provided. Thus, even though the focusing properties of the electrostatic lens component are varied simultaneously (common electrode) for all electron beams 12, the extraction field for the emitted secondary electrons can be kept constant.

Figure 13:
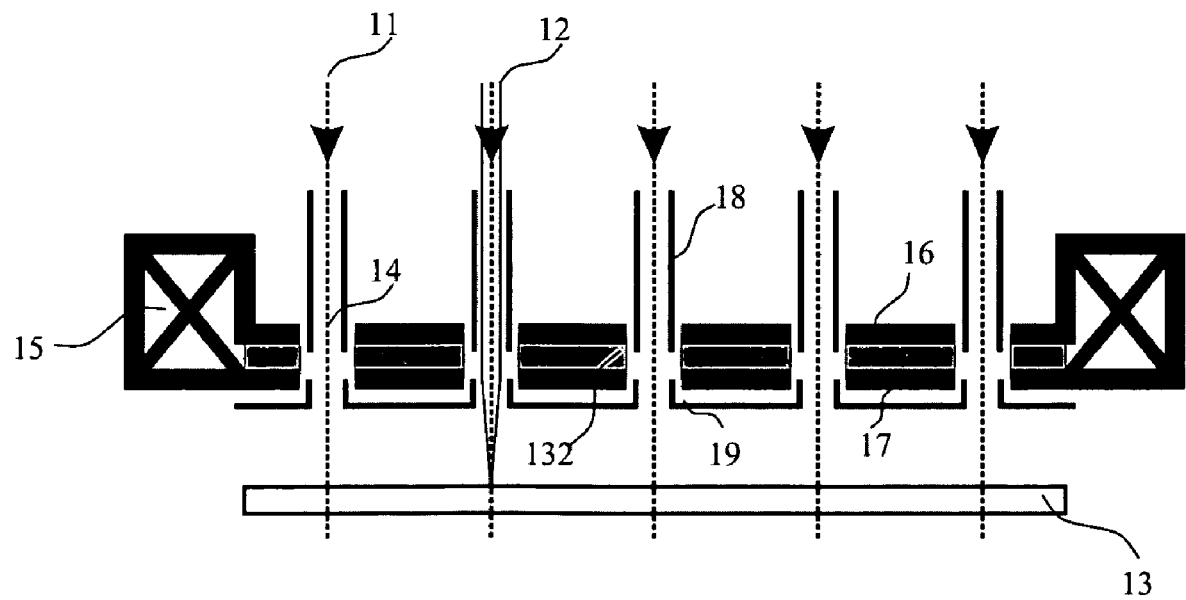
FIG. 13 shows a schematic side view of a further embodiment of an optical system according to the invention, wherein a layer between the pole pieces is provided.

As mentioned above, the upper and lower pole pieces of the magnetic lens component are used to guide the magnetic field of the excitation coil 15 to openings 14. In the embodiment of FIG. 13, an additional non-magnetic layer 132 is introduced between the upper pole piece 16 and the lower pole piece 17. Such a non-magnetic layer might be advantageous for different reasons. On the one hand, mechanical stability can be increased. Thus, smaller tolerances can be obtained more easily. This applies especially for industrial systems wherein vibrations due to vacuum pumps or external influences might be introduced. Further, if layer 132 is an electric conductor, layer 132 shields the openings 14 from interfering electric fields.

As shown with respect to FIG. 9, specimen 13 can be on a defined potential in order to influence the electrostatic immersion lens. Providing a potential to the specimen is also possible in the embodiment e.g. of FIG. 13 (charge control unit not shown) and other embodiments according to the present invention. Thus, with respect to the example of FIG. 13, it would be possible that electrode 19 and electrode 18 define the electrostatic lens, whereby the biased specimen modifies the electrostatic lens properties.

In the embodiments shown previously, the optical component comprises a magnetic lens component and an electrostatic lens component for focusing at least two charged particle beams with a common excitation coil. According to the following embodiments shown in FIGS. 14 and 15, it is preferred to further include scanning deflection means within the optical system. The scanning deflection means are used to scan the electron beam over the specimen. Generally, a deflection system for synchronous deflection of all electron beams can be applied. However, it might be even more preferred to have scanning deflection units that are individually controllable for each individual beam. A scanning deflection unit is generally used, in case the optical system described is an objective lens.

Figure 14:
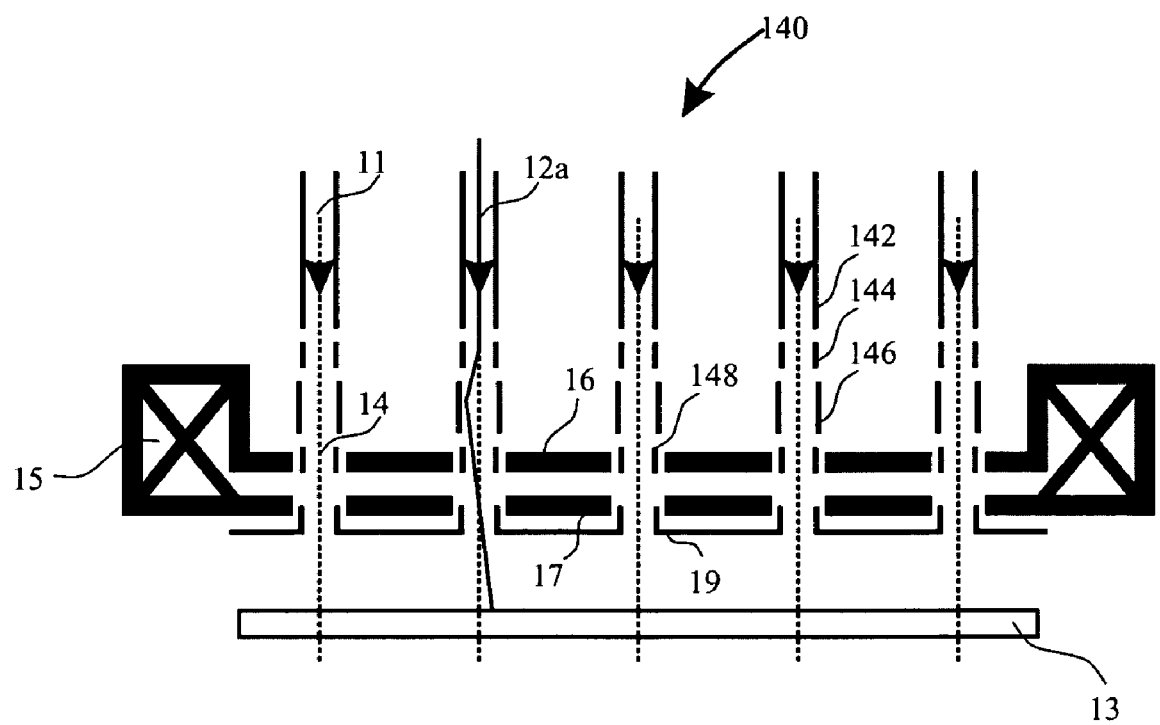
FIG. 14 shows a schematic side view of a further embodiment of an optical system according to the invention, wherein scan deflection means are included in the optical system.

FIG. 14 shows an embodiment with a two-stage pre-lens deflection system. Tube 142 guides the beam for example on a high positive potential (boost potential). Electron beam 12a is deflected away from the optical axis 11 by a first group of electrodes 144. A second group of electrodes 146 redirects the beam towards the optical axis. Upper electrode 148 and lower electrode 19 constitute the electrostatic lens component of the optical system. Due to the interaction of the first group 144 and second group 146 of electrodes, the electron beam 12 can be scanned across a specimen. This is illustrated in FIG. 14 by the fact that the electron beam impinges on specimen 13 off-axis.

The interaction of the first group of electrodes 144 and the second group of electrodes is preferably controlled as follows. In general (without compensating means) aberrations introduced by a lens system can be minimized if the beam travels through the lens on the optical axis. Thus, the two groups of deflection electrodes interact in a manner that electron beam 12a always travels through the magnetic and/or the electric lens component substantially on-axis.

A further embodiment (not shown) uses a post-lens deflection system. Thus, the beam also travels through the lens on-axis to reduce aberrations. In such a system, deflection of an electron beam takes place below the electrostatic and magnetic lens component of the optical system. However, the distance between the specimen and the optical system can in general not be minimized using such a solution. For this reason, the focal length cannot be sufficiently decreased. This however, hinders minimizing of spherical aberrations.

As mentioned with respect to the usage of multi-beam apparatuses, realizable electron beam currents limit high throughput particle beam devices and their resolution. This is due to electron-electron interactions. To reduce electron-electron interactions and thus improve the resolution, short optical beam ray traces can be advantageous. Therefore, short electron beam columns are required. The pre-lens deflection means and the post-lens deflection means require additional column length. In view of this, it can be preferred when the scanning deflection unit is located within the lens.

Figure 15:
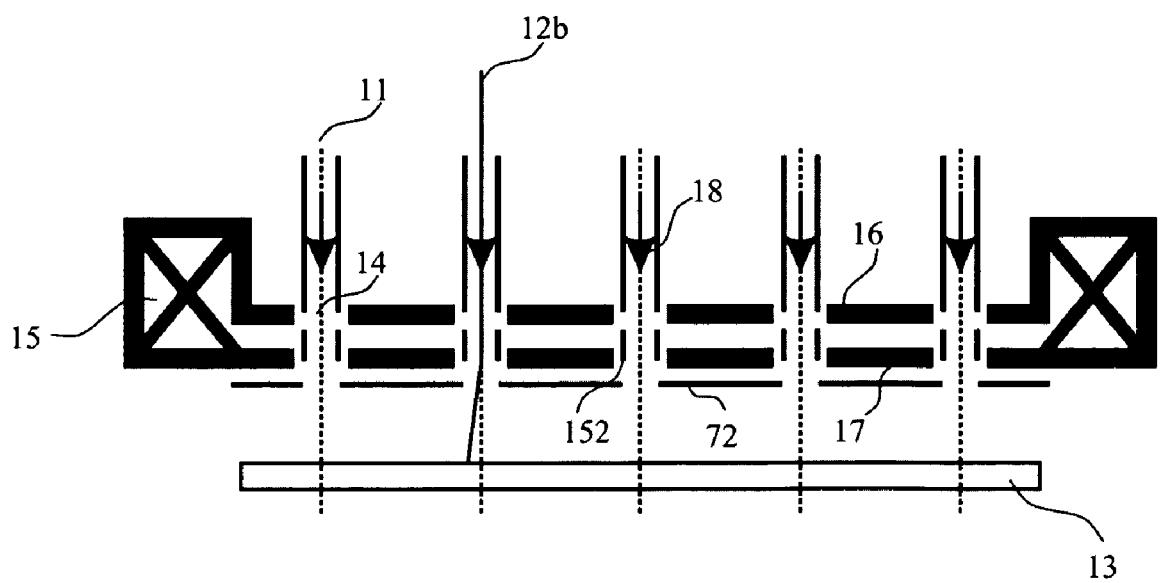
FIG. 15 shows a schematic side view of a further embodiment of an optical system according to the invention, wherein scan deflection means are included in the optical system.

An in-lens deflection system is shown in the embodiment of FIG. 15. Thereby, an upper electrode 18 and a lower electrode 72 of the electrostatic lens component are provided. Between these electrodes and substantially between the upper pole piece 16 and the lower pole piece 17 of the magnetic lens component, there is a group of electrodes 152 to deflect the electron beam 12b. This deflection is used for scanning the electron beam over an area of the specimen.

The means for a scanning deflection discussed above made use of electrostatic deflectors. According to the present invention, it should be understood that magnetic deflectors or electrostatic-magnetic deflectors could substitute these purely deflectors.

Further, it should be within the scope of the present invention that these deflectors could alternatively be realized as an octupole or a higher order multipole element. If so, this e.g. octupole scan deflection system might in addition be used for correction of astigmatism. Thus, the space required for a stigmator can be avoided. Thereby, the column length can be further reduced. However, for the sake of simplicity, dipole or quadrupole deflectors can also be used.

Figure 16:
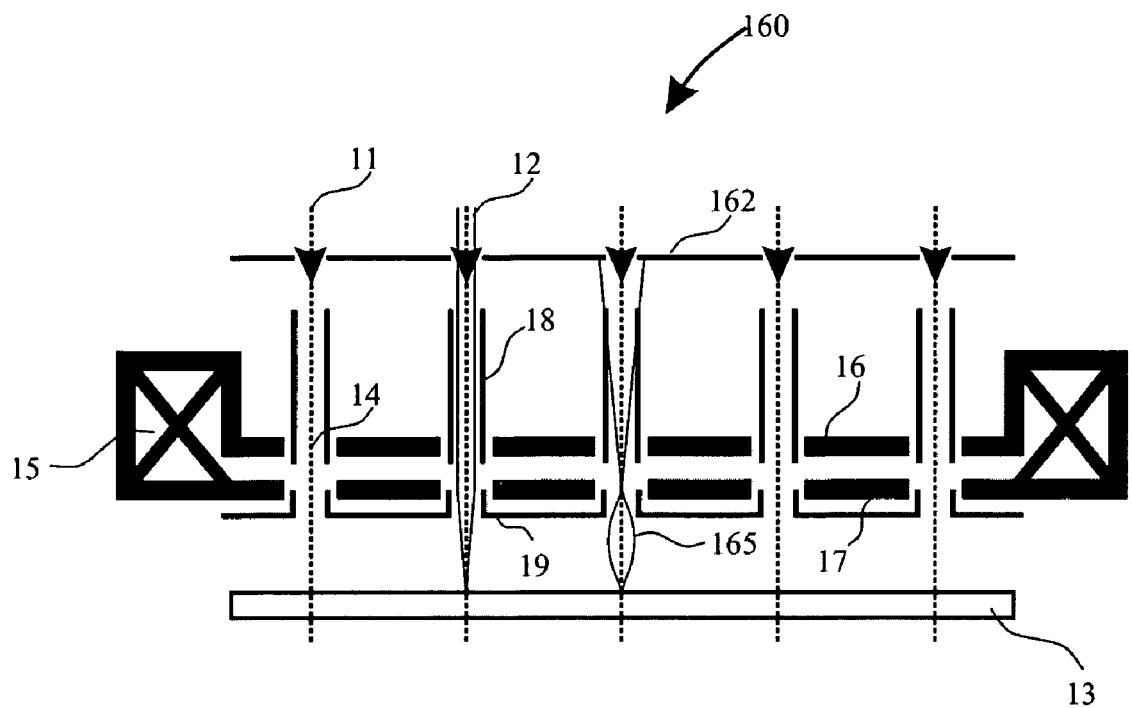
FIG. 16 shows a schematic side view of a further embodiment of an optical system according to the invention, wherein detection means are included in the optical system.
Figure 17:
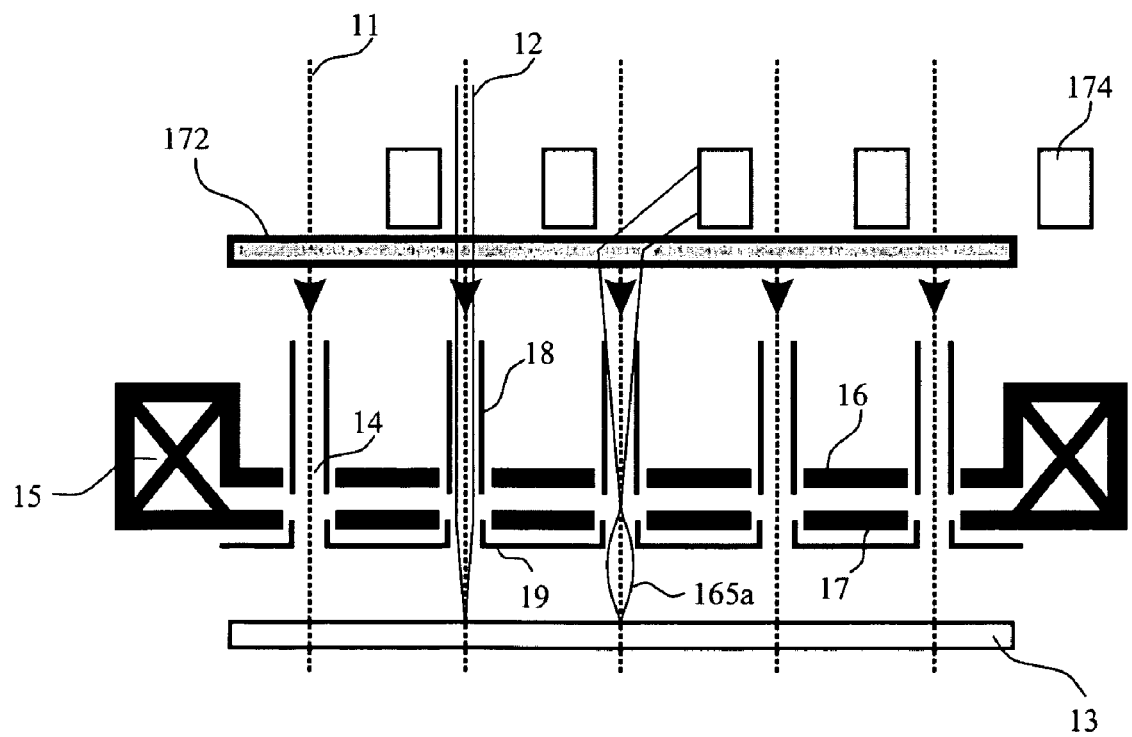
FIG. 17 shows a schematic side view of a further embodiment of an optical system according to the invention, wherein detection means are included in the optical system.

Optionally, further components might be added to an optical system according to the present invention. The embodiments shown in FIGS. 16 and 17 show additional detection means. The optical system 160 in FIG. 16 comprises an excitation coil 15, upper and lower pole pieces 16 and 17 and electrodes 18, 19 for the electrostatic lens component. Electron beams 12 impinge on specimen 13 and thereby release secondary and backscattered particles. As an example, the following description refers to secondary electrons. The retarding field of electrode 19 simultaneously acts as an acceleration field for the charged particles to be detected. The secondary electron signals 165 penetrate the lens system. Thus, detectors 162 detect the released secondary electrons from each primary electron beam 12.

Alternatively, detectors 162 might be located below the lens or within the lens. Further, it is possible to have different detector types within one optical system. Preferably, for each electron beam an individual detector 162 is provided.

The embodiment of FIG. 16 comprises axial detectors. It is within the scope of protection of the present invention that coaxial or segment ring detectors could also be used. As shown in FIG. 17, a different embodiment uses off-axial detectors. In FIG. 17 a beam separator 172 is provided. Beam separator 17 could be a Wien-type component or any deflection unit that is capable of separating the primary electron beam 12 and the secondary electron signals 165*a*.

By this separation, secondary particles are deflected towards detectors 174. Even though FIG. 17 shows a two-dimensional sketch of the embodiment, it is apparent that detectors 174 could be located in any direction around the optical axis 11.

FIGS. 1 to 17 illustrate several embodiments, whereby the usage of the optical system, the location of openings 14, the upper and lower pole pieces, the lower electrodes of the electrostatic lens component, the formation of the electrostatic lens component, means for individually adjusting the imaging properties for individual electron beams, extraction electrodes, construction of the pole piece area, deflection means and detection means have been discussed. It is to be understood within the present invention that all of the features mentioned above can be arbitrarily combined, unless they are mutually exclusive.

Figure 18:
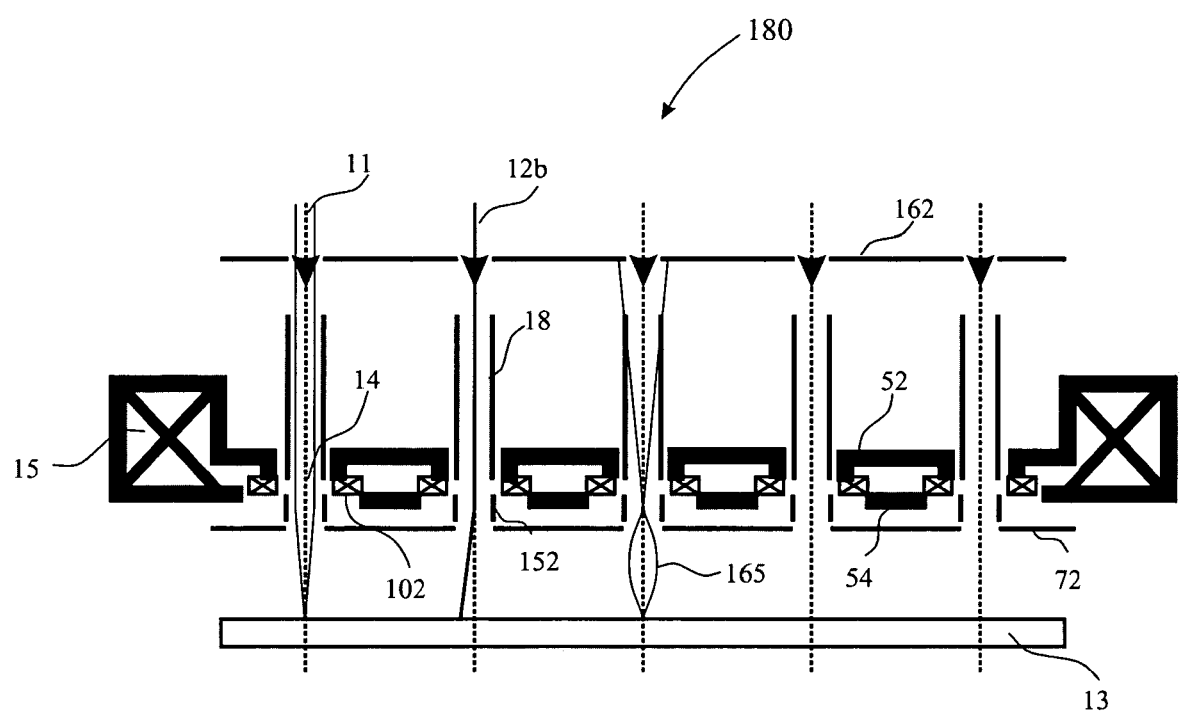
FIG. 18 shows a schematic side view of a further embodiment of an optical system according to the invention, wherein several feature modifications are combined.

To give one example for such a combination, one further embodiment is illustrated in FIG. 18.

The optical system 180 comprises an excitation coil 15 and upper and lower pole pieces 52 and 54, respectively. Further, there are means provided for individually adjusting the imaging properties for each electron beam 12. These means are small magnetic coils 102. The electrostatic lens component comprises upper electrode 18 and lower electrode 72. Further, deflection means are provided due to in-lens deflectors 152. Thus, electron beam 12*b* can be scanned over specimen 13. Secondary particles penetrate the optical system through the same openings 14 used for the primary electron beam. An axial detector 162 for each of the respective secondary particle signals 165 is used for imaging the sample during inspection or the like.

The embodiment of the optical system 180 makes use of a combined axial- and radial-gap magnetic lens component. The electrostatic lens component is given by upper electrode 18 and lower planar electrode 72. A fine adjustment of lens component variations can be achieved due to small magnetic coils 102. Electron beams 12*b* following the optical axis 11 above the optical system are deflected by groups of in-lens deflection electrodes 152. Further, secondary particle signals 165 emitted from specimen 13 are detected by axial detectors 162.

Figure 19A:
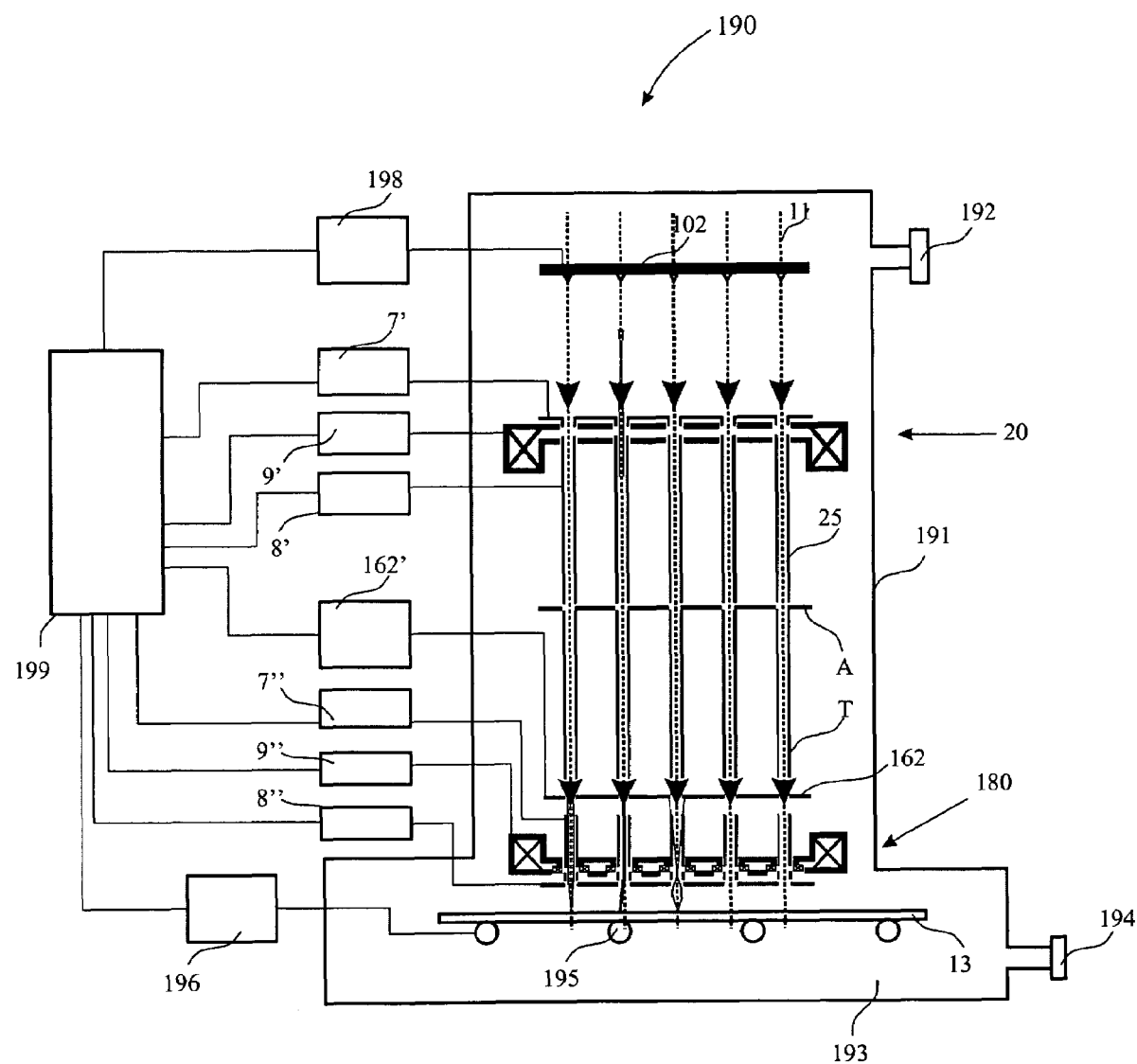
FIG. 19*a* shows a schematic side view of an embodiment of a charged particle beam column according to the invention.

Optical system 180 can be integrated into a charged particle beam column. One exemplary embodiment of an electron beam column 190 is illustrated in FIG. 19*a*. The electron beam column comprises a housing 191, which can be evacuated through at least one port 192. Housing 192 is connected to a specimen chamber 193. A further port 194 for evacuating the specimen chamber is provided. Within the specimen chamber 193, specimen 13 is placed on a specimen stage 195, which can move the specimen relative to the optical axes.

The electron beam column further comprises an array of electron emitters. A plurality of primary electron beams is emitted, whereby in general each emitter tip emits one electron beam. The plurality of beams is formed by an optical system 20 in the form of a condenser lens. Lower electrode 25 of the electrostatic lens component of optical system 20 extends up to the next optical component. Thus, electron beams 12 are maintained on a high potential, thereby allowing aberrations to be reduced. As an example for further optical systems, beam-shaping aperture A is provided between condenser lens 20 and objective lens 180. Further optical components might be required. After apertures A, electron beams 12 are further guided in tubes T. Optical system 180, including detectors 162 and scan deflection means, is used for focusing electron beams on the specimen, scanning electron beams 12 over the specimen and detecting secondary particles.

The components illustrated in FIG. 19*a* are controlled by respective controllers. These controllers are not necessarily separated, but could partly be integrated into a single system or housing. Emitter control unit 198 controls electron emitter array 102. Thereby, the electron beam currents and potentials of respective electrodes like an anode are controlled. Preferably, emitter control unit 198 is capable of controlling electron beams 12 of each emitter tip individually. Condenser lens 20 comprises an electrostatic and a magnetic lens component. Each of these components is controlled by a respective lens controller 7', 8' and 9', respectively. Detectors 162 are connected to an imaging unit 162'. Thereby, as an example, high voltage control for electron multipliers as well as frame grabbers and image calculation units might be provided for each detector 162. The electrostatic and magnetic lens components of objective lens 180 are controlled by their respective controllers 7", 8" and 9". A further controller (not shown) for the scan deflection means, if not integrated in one of the other control units, can be provided. Stage movement is controlled via stage controller 196, to move specimen 13 in several directions independently. A central computer like a workstation and/or personal computer with a GUI or further control means for vacuum pumps (not shown) or other internal and external components acts as a system controller 199.

Aperture A can be used as a beam-limiting aperture. By limiting the beam current of the individual beams, the electron-electron interaction can be reduced. If aperture A is used as a beam-limiting aperture, it is preferred to position the aperture close to emitter array 102. Thus, the path with reduced beam current is increased and electron-electron interaction can be minimized. In case a beam-limiting aperture A is disposed below condenser lens 20, the beam current can be adjusted by controlling the condenser lens excitation.

Figure 19B:
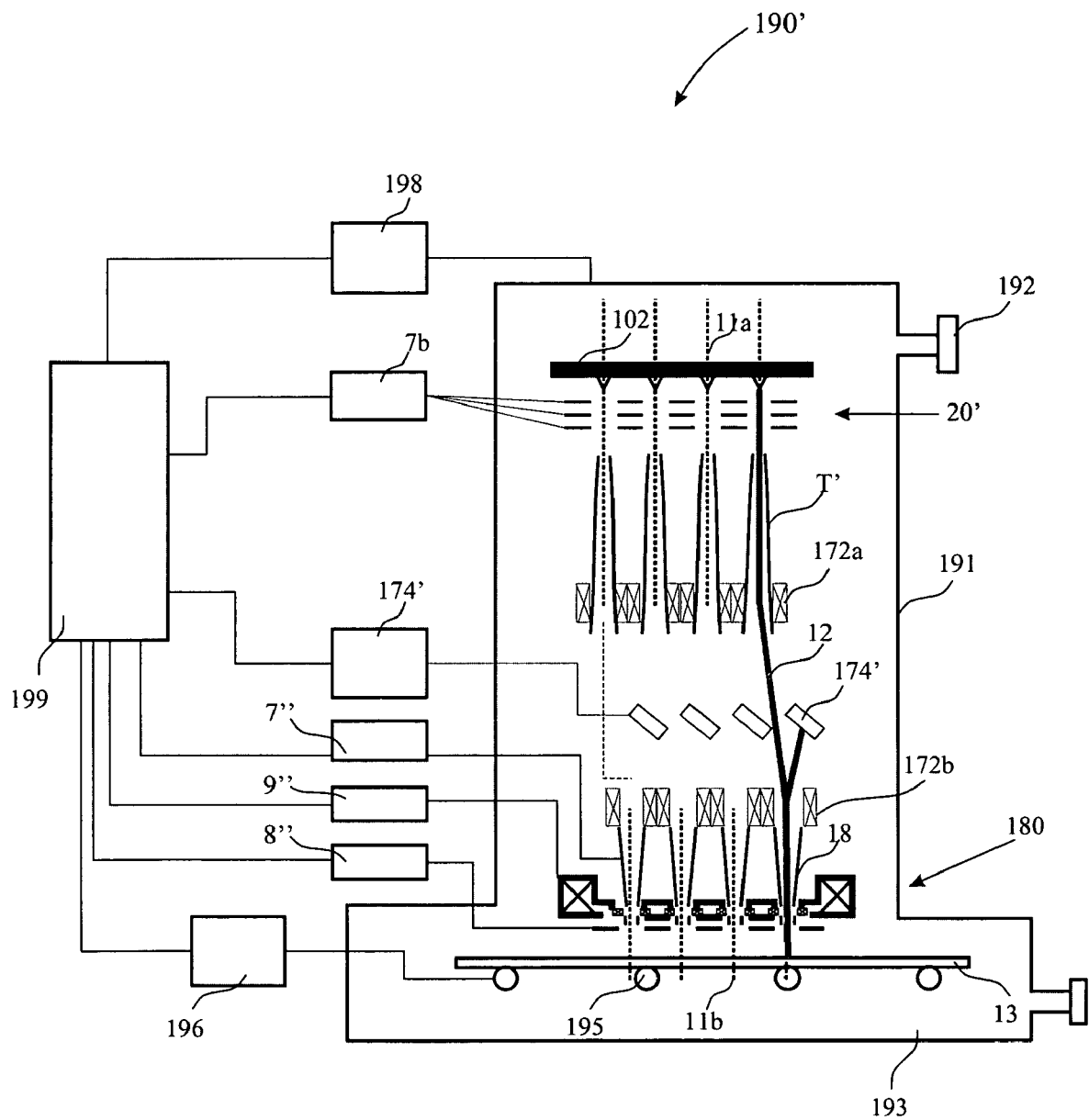
FIG. 19*b* shows a schematic side view of a further embodiment of a charged particle beam column according to the invention.
Figure 20:
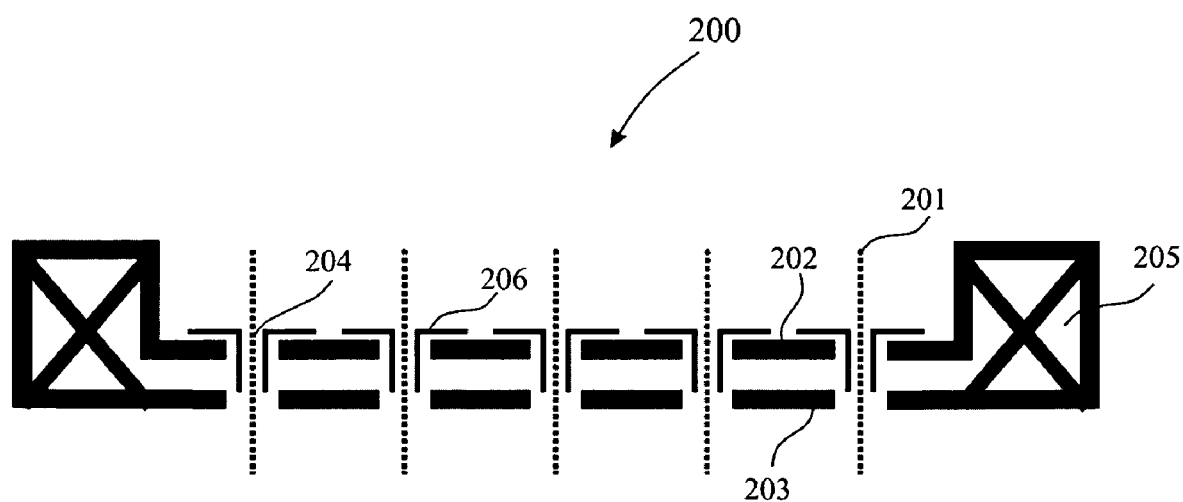
FIG. 20 shows an optical system according to the state of the art.

According to a further aspect of the present invention, an electrostatic lens for a plurality of beams could replace condenser lens 20 in FIG. 19*a*. Thereby, an einzel-lens can be used. According to different embodiments, electrodes of the einzel-lens can be formed separately, in combination with an anode or in combination with an extraction electrode of an emitter. A further embodiment, including an einzel-lens as a condenser lens is shown in FIG. 19*b*. In FIG. 19*b*, controller 7*b* is used to apply respective potentials to einzel-lens 20'.

Further differences between the exemplary electron beam column shown in FIG. 19*b* and the electron beam column shown in FIG. 19*a* will now be described. The optical axes 11*a* and 11*b* are displaced with respect to each other. Thereby, two magnetic deflection systems 172*a* and 172*b* are used. Due to the use of magnetic deflectors the primary beam and the secondary beam emitted by the specimen is separated while traveling through the second deflector 172*b*. Thus, detector 174 can be located closer to the (second) optical axis 11*b*. All detectors 174 are connected to controller 174'. Therein, the images corresponding to each scanning area of each of the electron beams are read from the detector and further processed.

Instead of the deflection system with two magnetic deflectors shown in FIG. 19b also a deflection system with three, four or more magnetic deflectors can be used. Additionally, the magnetic deflectors can completely or partly be substituted by electric or electromagnetic deflectors. Thereby, it has to be taken into account that a different beam-separation or no beam-separation at all might occur. Further, the primary electron beam might be deflected back on a single optical axis. Thus, the electron beam might be deflected around a deflector approximately located on the optical axis.

The possibilities for deflecting the beam off-axis or separating the optical axis in two displaced optical axes 11a and 11b can be combined according to the necessity of the application.

According to an even further aspect of the present invention, detectors 162 or 174 can further comprise a spectrometer, e.g. in form of a grid, several grids, a Wien-filter or the like. Thereby, a spectrometer-detector arrangement is formed. A spectrometer can be used to control the energy of the detected secondary or backscattered particles. By the characterization of the energy of the particles released at the specimen, e.g. a separation of secondary and backscattered particles can be achieved.

The invention claimed is:

1. An optical system for a charged particle multi-beam system, comprising:
    an electrostatic lens component for a plurality of charged particle beams having at least two electrostatic sub-lenses; and
    a magnetic lens component for a plurality of charged particle beams having at least two magnetic sub-lenses, wherein the sub-lenses share a common excitation coil;
    wherein the electrostatic and the magnetic lens component form a multi-lens for a plurality of charged particle beams having at least two sub-lenses; and
    wherein each sub-lens comprises an opening for a charged particle beam and each sub-lens is adapted to focus a charged particle beam.

2. The optical system of claim 1, wherein each of the at least two electrostatic sub-lenses comprises one or more electrodes on a common potential.

3. The optical system of claim 1, wherein each of the at least two electrostatic sub-lenses comprises one or more first and second electrodes.

4. The optical system of claim 3, wherein the first electrodes of the at least two electrostatic sub-lenses are on a common potential and the second electrodes of the at least two electrostatic sub-lenses are on a common potential.

5. The optical system of claim 1, wherein the electrostatic lens component for the charged particle beams is an immersion lens component for the charged particle beams.

6. The optical system of claim 1, wherein the electrostatic lens component for the charged particle beams is a retarding lens component for the charged particle beams.

7. The optical system of claim 1, wherein the magnetic sub-lenses are radial-gap lenses.

8. The optical system of claim 1, wherein the magnetic sub-lenses are axial-gap lenses.

9. The optical system of claim 1, wherein the magnetic sub-lenses are radial-axial-gap lenses.

10. The optical system of claim 1, wherein a lens field area of the electrostatic sub-lens is below a lens field area of the respective magnetic sub-lens.

11. The optical system of claim 1, wherein a lens field area of the electrostatic sub-lens is above a lens field area of the respective magnetic sub-lens.

12. The optical system of claim 1, wherein a lens field area of the electrostatic sub-lens and a respective lens field area of the magnetic sub-lens overlap.

13. The optical system of claim 1, wherein one electrode of each of the at least two electrostatic sub-lenses is on a beam boost potential.

14. The optical system of claim 1, further comprising means for fine focusing.

15. The optical system of claim 1, further comprising an extraction electrode component with an extraction electrode for each of the at least two charged particle beams.

16. The optical system of claim 1, further comprising a scan deflection unit.

17. The optical system of claim 1, further comprising an individual scan deflection unit for each of the at least two charged particle beams.

18. The optical system of claim 16, wherein the scan deflection unit is an in-lens scan deflection unit.

19. The optical system of claim 1, further comprising a detection unit.

20. The optical system of claim 19, wherein the detection unit comprises a spectrometer.

21. A method for focusing at least two charged particle beams on a specimen, comprising:
    providing an optical system comprising:
        an electrostatic lens component for a plurality of charged particle beams having at least two electrostatic sub-lenses; and
        a magnetic lens component for a plurality of charged particle beams having at least two magnetic sub-lenses; and
        at least two separate openings for each of the at least two charged particle beams traveling through the optical system;
    controlling a current for an excitation coil of the magnetic lens component, thereby focusing the at least two electron beams; and
    controlling at least two potentials of the electrostatic lens component, thereby focusing the at least two electron beams.

22. The method of claim 21, wherein each of the electrostatic sub-lenses is provided with one or more first and second electrodes.

23. The method of claim 22, further comprising controlling the first electrodes or the second electrodes separately for each of the at least two electrostatic sub-lenses.

24. The method of claim 21, further controlling focusing properties correction means.

25. The method of claim 21, further scanning the at least two charged particle beams over an area of the specimen.

26. A multiple charged particle beam device, comprising;
    a charged particle beam source;
    a detector for detecting secondary particles;
    beam shaping means;
    a housing for the charged particle beam column, wherein the housing can be evacuated;
    at least one optical system comprising;

an electrostatic lens component for a plurality of charged particle beams having at least two electrostatic sub-lenses; and a magnetic lens component for a plurality of charged particle beams having at least two magnetic sub-lenses, wherein the sub-lenses share a common excitation coil;

wherein the electrostatic and the magnetic lens component form a multi-lens for a plurality of charged particle beams having at least two sub-lenses;

wherein each sub-lens comprises an opening for a charged particle beam; and wherein each sub-lens is adapted to focus a charged particle beam; and at least one control unit for the at least one optical system.

27. The multiple charged particle beam device of claim 26, further comprising a deflection unit for directing the charged particle beam away from the optical axis and redirecting the charged particle beam.

28. The multiple charged particle beam device of claim 27, wherein the deflection unit comprises at least two magnetic deflectors.

* * * * *